United States Patent
Yüksel et al.

(10) Patent No.: US 10,256,845 B1
(45) Date of Patent: Apr. 9, 2019

(54) SYMBOL TIMING RECOVERY BASED ON SPECULATIVE TENTATIVE SYMBOL DECISIONS

(71) Applicant: International Business Machines Corporation, Armonk, NY (US)

(72) Inventors: Hazar Yüksel, Kilchberg (CH); Giovanni Cherubini, Rueschlikon (CH); Roy Cideciyan, Rueschlikon (CH); Simeon Furrer, Altdorf (CH); Marcel Kossel, Reichenburg (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/904,806

(22) Filed: Feb. 26, 2018

(51) Int. Cl.
*H04L 7/02* (2006.01)
*H03M 13/41* (2006.01)
*H04L 7/00* (2006.01)
*H03L 7/081* (2006.01)

(52) U.S. Cl.
CPC .......... *H03M 13/41* (2013.01); *H04L 7/0029* (2013.01); *H04L 7/0062* (2013.01); *H03L 7/0814* (2013.01); *H03L 2207/50* (2013.01)

(58) Field of Classification Search
CPC ... H04L 7/0016; H04L 7/0025; H04L 7/0029; H04L 7/0062; H04L 7/0066; H04L 7/0087; H03L 2207/05; H03L 2207/06; H03L 2207/50; H03L 7/0814
See application file for complete search history.

(56) References Cited

U.S. PATENT DOCUMENTS

| | | | |
|---|---|---|---|
| 7,957,251 B2 | 6/2011 | Ratnakar et al. | |
| 8,018,360 B2 | 9/2011 | Nayak | |
| 8,237,597 B2 | 8/2012 | Liu et al. | |
| 8,284,870 B1 * | 10/2012 | Marrow | H04L 25/03057 375/326 |
| 8,295,001 B2 | 10/2012 | Liu et al. | |
| 8,862,972 B2 | 10/2014 | Seago et al. | |

(Continued)

OTHER PUBLICATIONS

Barry et al., "Digital Communication," Springer Science & Business Media, 2004, 4 pages.

(Continued)

*Primary Examiner* — Siu M Lee
(74) *Attorney, Agent, or Firm* — Cantor Colburn LLP; Daniel Morris

(57) ABSTRACT

A method for timing recovery for a high-speed data transmission system may be provided. The method comprises receiving an analog input signal at an ADC and passing processed digital signal samples to a Viterbi detector. The method also comprises receiving at least one processed signal sample and at least two sets of at least one candidate symbol each from the Viterbi detector and/or the processed signal samples by timing error detectors and forwarding output digital signals of the timing error detectors via loop filters to related multiplexers. Furthermore, the method comprises selecting one digital signal from each of the multiplexers using a select signal generated by the Viterbi detector, and deriving a control signal controlling a sampling clock of the analog-to-digital converter by at least one of the selected digital signals from the multiplexers.

20 Claims, 8 Drawing Sheets

(56) References Cited

U.S. PATENT DOCUMENTS

| | | | | |
|---|---|---|---|---|
| 2003/0182618 A1* | 9/2003 | Chen | ................... | H03M 1/1028 |
| | | | | 714/794 |
| 2005/0185742 A1* | 8/2005 | Liu | ........................ | H04L 7/007 |
| | | | | 375/348 |
| 2006/0256896 A1* | 11/2006 | Venkataramani | ......... | H03L 7/00 |
| | | | | 375/341 |
| 2008/0239161 A1* | 10/2008 | Kim | ....................... | H04L 7/027 |
| | | | | 348/720 |

OTHER PUBLICATIONS

Christiansen, "Modeling of PRML timing loop as a Kalman filter," IEEE Global Telecommunications Conference, vol. 2, 1994, pp. 1157-1161.

Gardner, "Interpolation in Digital Modems—Part I: Fundamentals," IEEE Transactions on Communications, vol. 41, No. 3, 1993, pp. 501-507.

Meyr et al., "Digital Communication Receivers: Synchronization, Channel Estimation, and Signal Processing," New York: Wiley, 1998, 7 pages.

Patapoutian, "Data-Dependent Synchronization in Partial-Response Systems," IEEE Transactions on Signal Processing, vol. 54, No. 4, 2006, pp. 1494-1503.

Spurbeck et al., "Interpolated Timing Recovery for Hard Disk Drive Read Channels," IEEE International Conference on Communications, vol. 3, 1997, pp. 1618-1624.

\* cited by examiner

FIG. 7

SYMBOL TIMING RECOVERY BASED ON SPECULATIVE TENTATIVE SYMBOL DECISIONS

BACKGROUND

The invention relates generally to a method for data transmission, and more specifically, to a method for timing recovery for a high-speed data transmission system. The invention relates further to a related timing recovery system for a high-speed data transmission system.

A growing communication bandwidth is a widespread requirement of the information society. The amount of content transmitted, and/or shared over communication lines grows continuously and with it the need for higher data transmission speeds. Data in the original form of digital signals on a sender side of a communication link may arrive as analog signals on the receiver side, affected by signal degradation, phase shifts and noise addition. Thus, the signals received need to be reliably detected in order to allow an interpretation of the original meaning. For this, a reconstruction of the originally used timing of the signals is essential. Sequence detectors are used for detecting a sequence of data symbols communicated via an analog signal transmitted over a communication link, whose output may be sampled on the receiver side. For a given sample sequence received via the communication link, the objective of such detectors is to determine the most likely symbol values for the symbol sequence supplied to the receiver input. In data transmission, a sequence of input symbols drawn from a signal constellation is typically used to modulate some analogue waveform, which is transmitted through a dispersive channel and sampled at the receiver. Those samples would ideally equal the corresponding sender side symbols. However, they are corrupted by noise and interference with neighboring transmitted symbols. The latter phenomenon is commonly referred to as intersymbol interference (ISI). Often used Viterbi detectors (also denoted as Viterbi decoders) use maximum-likelihood detection methods to determine the most probable input symbol sequence. For high-speed data transmission, such detectors play an instrumental role in designing receivers in compliance with the recently approved communication standards, like the IEEE P802.3bj standard for 100 Gb/s Ethernet, and upcoming communication standards, IEEE P802.3bs standard for 400 Gb/s Ethernet.

Typically, sequence detectors comprise a plurality of units and modules working together and processing the incoming analog input signal into digital samples representing the components of one or more symbols. In order to perform a correct symbol detection, it is necessary to derive the most appropriate timing underlying the incoming sequence of symbols. Appropriate phase shift and frequency offset need to be determined in order to get the timing right and interpret the incoming data stream in such a way that—even at the highest communication speed allowed by the transmission channel—the originally sent symbols may be reconstructed without any error or a very small error rate. Techniques like deriving tentative symbol decisions are known from documents of the state-of-the-art. However, in order to increase the communication speed over existing communication lines, the known methods and related systems have to be advanced in order to guarantee a reliable symbol detection at the receiver side of the communication link.

SUMMARY

According to one aspect of the present invention, a method for timing recovery for a high-speed data transmission system may be provided. The method may comprise receiving an analog input signal at an analog-to-digital converter and passing processed digital signal samples to a Viterbi detector. Additionally, the method may comprise receiving, using timing error detectors, at least one processed signal sample and at least two sets of at least one candidate symbol, each of which is from at least one selected out of the Viterbi detector and the processed signal samples.

Furthermore, the method may comprise forwarding output digital signals of the timing error detectors via loop filters to related multiplexers, selecting one digital signal from each of the multiplexers using a select signal generated by the Viterbi detector, and deriving a control signal controlling a sampling clock of the analog-to-digital converter by at least one of the selected digital signals from the multiplexers.

According to another aspect of the present invention, a timing recovery system for a high-speed data transmission system may be provided. The system may comprise an analog-to-digital converter adapted for receiving an analog input signal, a Viterbi detector adapted for receiving processed digital signal samples, and timing error detectors adapted for receiving at least one processed signal sample and at least two sets of at least one candidate symbol, each from at least one selected out of the Viterbi detector, and the processed signal samples.

Moreover, the timing recovery system may comprise loop filters relating to output signals of the timing error detectors and multiplexers relating to the loop filters. Thereby, the Viterbi detector may be adapted for generating a select signal adapted for selecting one digital signal from each of the multiplexers.

Additionally, the timing recovery system may comprise an adjustable oscillator adapted for deriving a sampling clock signal of the analog-to-digital converter controlled by at least one of the selected digital signals from the multiplexers.

Furthermore, embodiments may take the form of a related computer program product—e.g., for simulation purposes—accessible from a computer-usable or computer-readable medium providing program code for use, by, or in connection, with a computer or any instruction execution system. For the purpose of this description, a computer-usable or computer-readable medium may be any apparatus that may contain means for storing, communicating, propagating or transporting the program for use, by, or in connection, with the instruction execution system, apparatus, or device.

BRIEF DESCRIPTION OF THE DRAWINGS

It should be noted that embodiments of the invention are described with reference to different subject-matters. In particular, some embodiments are described with reference to method type claims, whereas other embodiments are described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above, as well as, further aspects of the present invention, are apparent from the examples of embodiments to be described hereinafter and are explained with reference to the examples of embodiments, but to which the invention is not limited.

Figure 1:
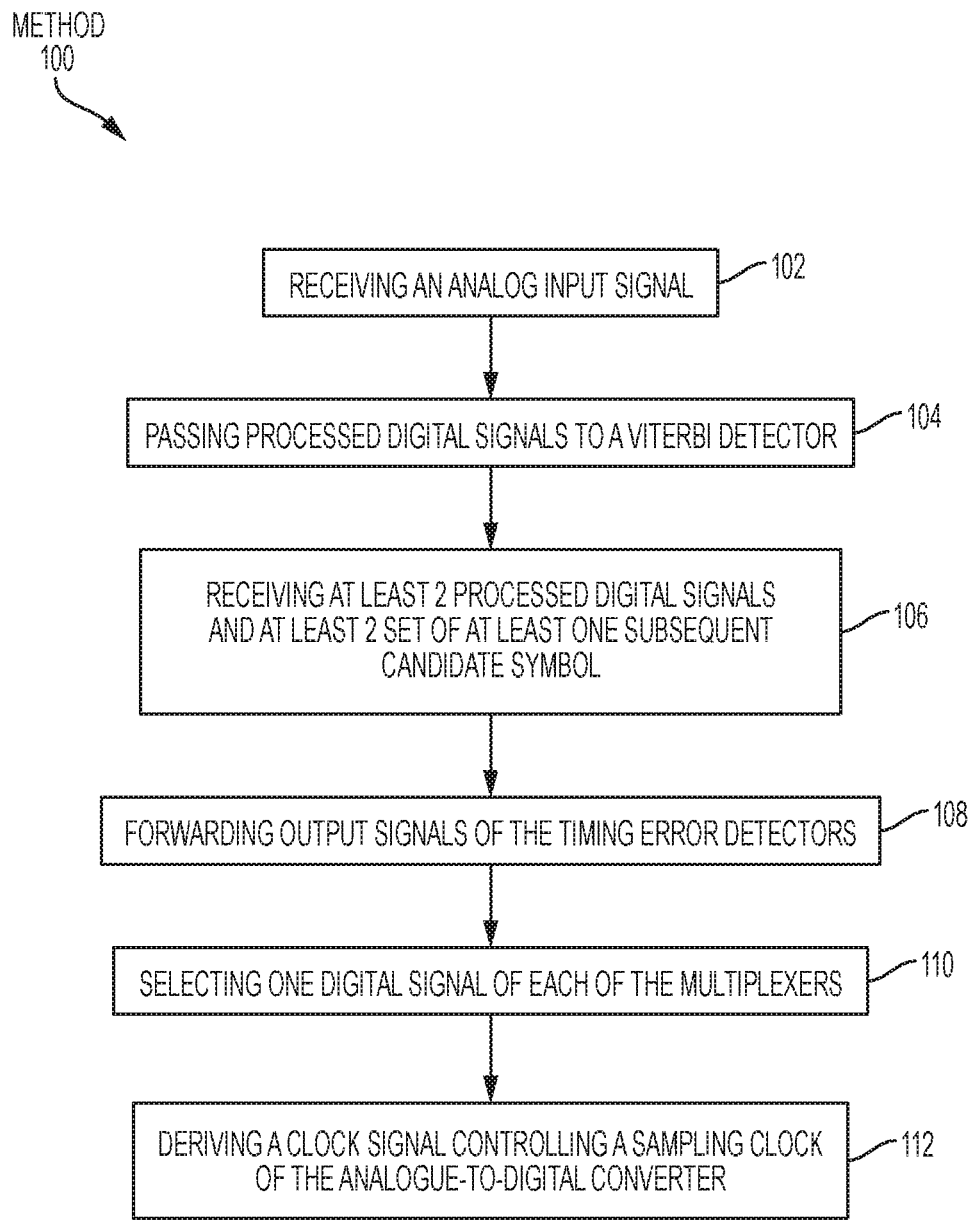

Embodiments of the invention will be described, by way of example only, and with reference to the following drawings:

FIG. 1 shows a block diagram of an embodiment of the inventive method for timing recovery for a high-speed data transmission system.

Figure 2:
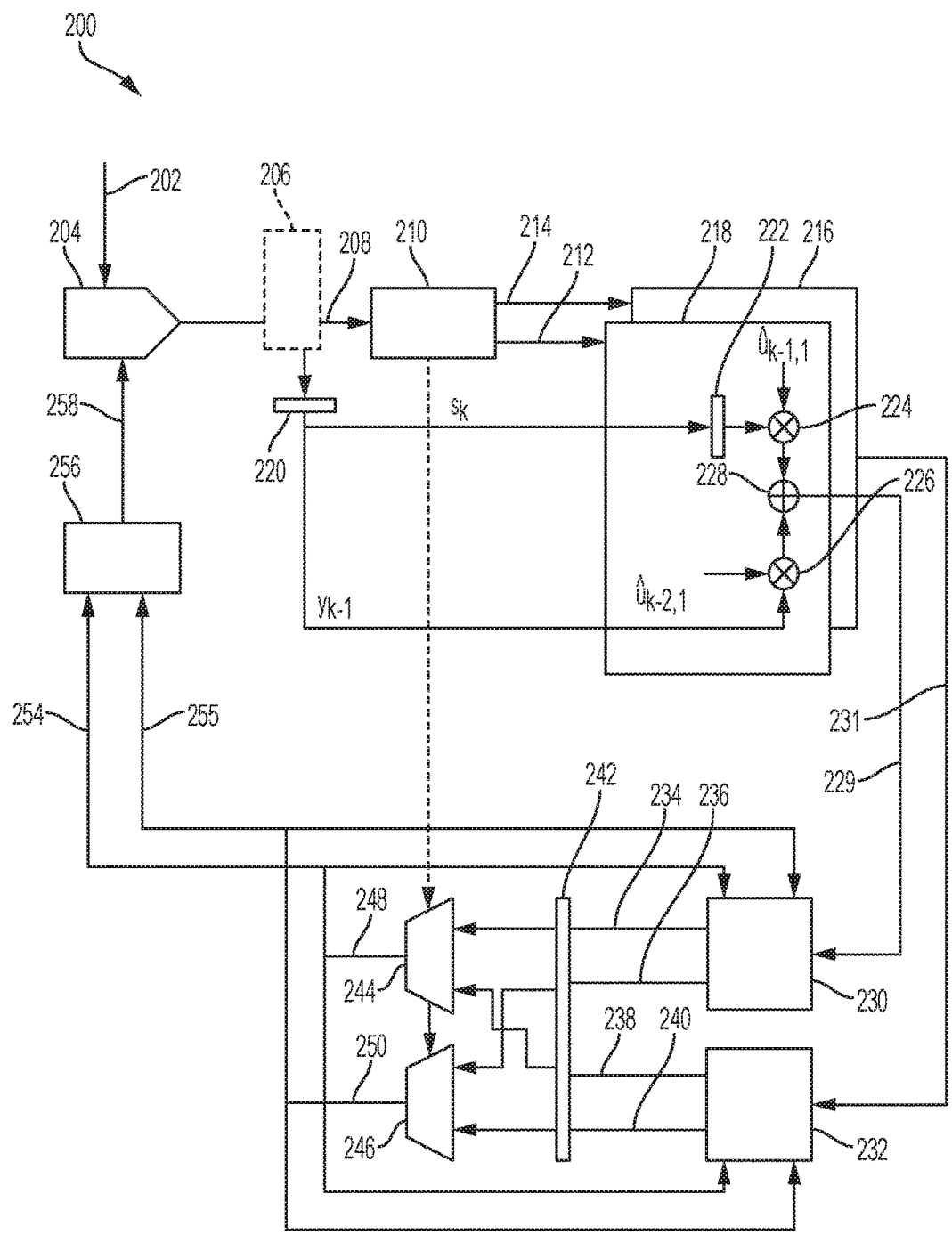

FIG. 2 shows a block diagram of an embodiment of the inventive timing recovery system.

Figure 3:
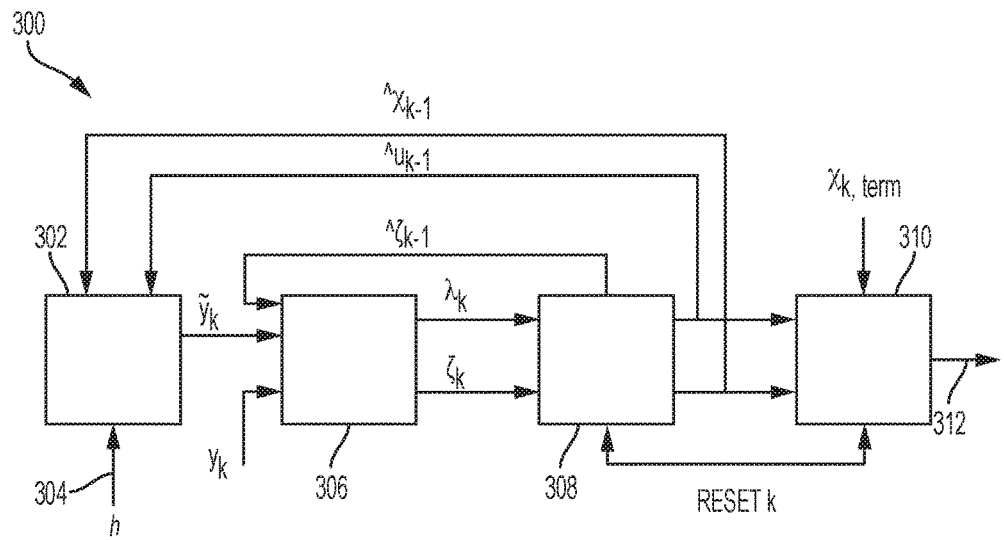

FIG. 3 shows a block diagram of a Viterbi detector.

Figure 4:
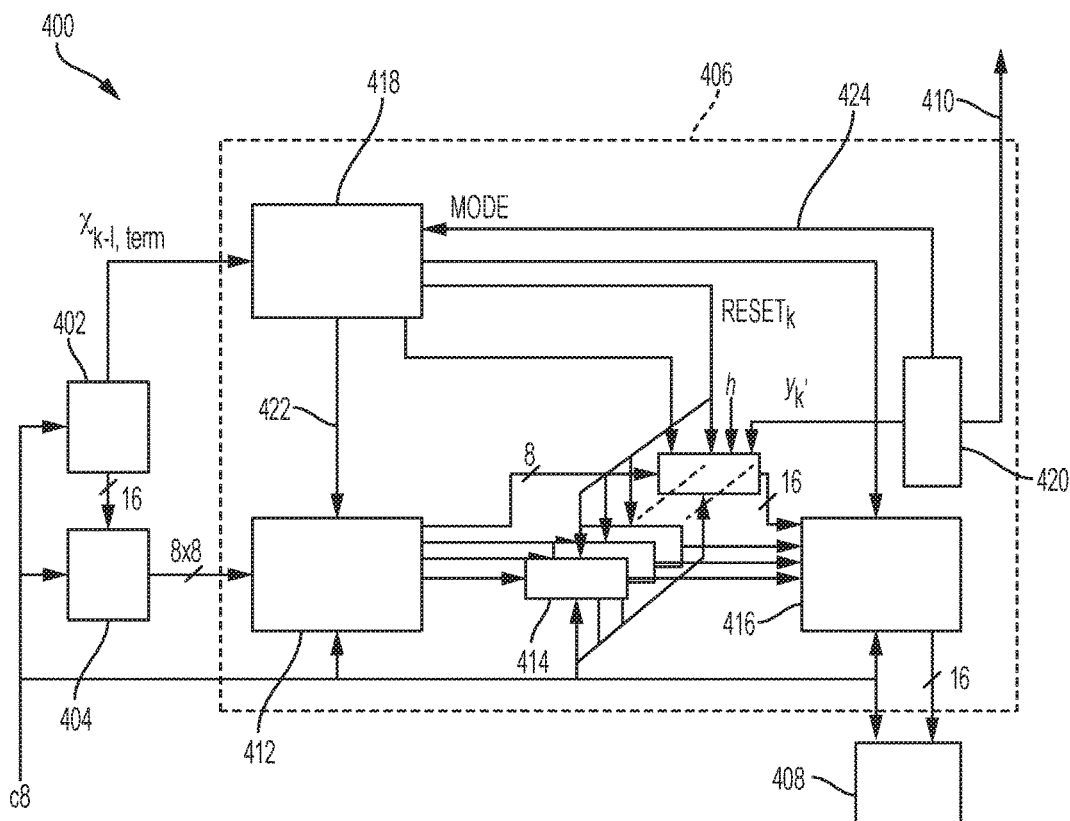

FIG. 4 shows a block diagram of an embodiment of the general architecture used for the implementation of the Viterbi detector.

Figure 5:
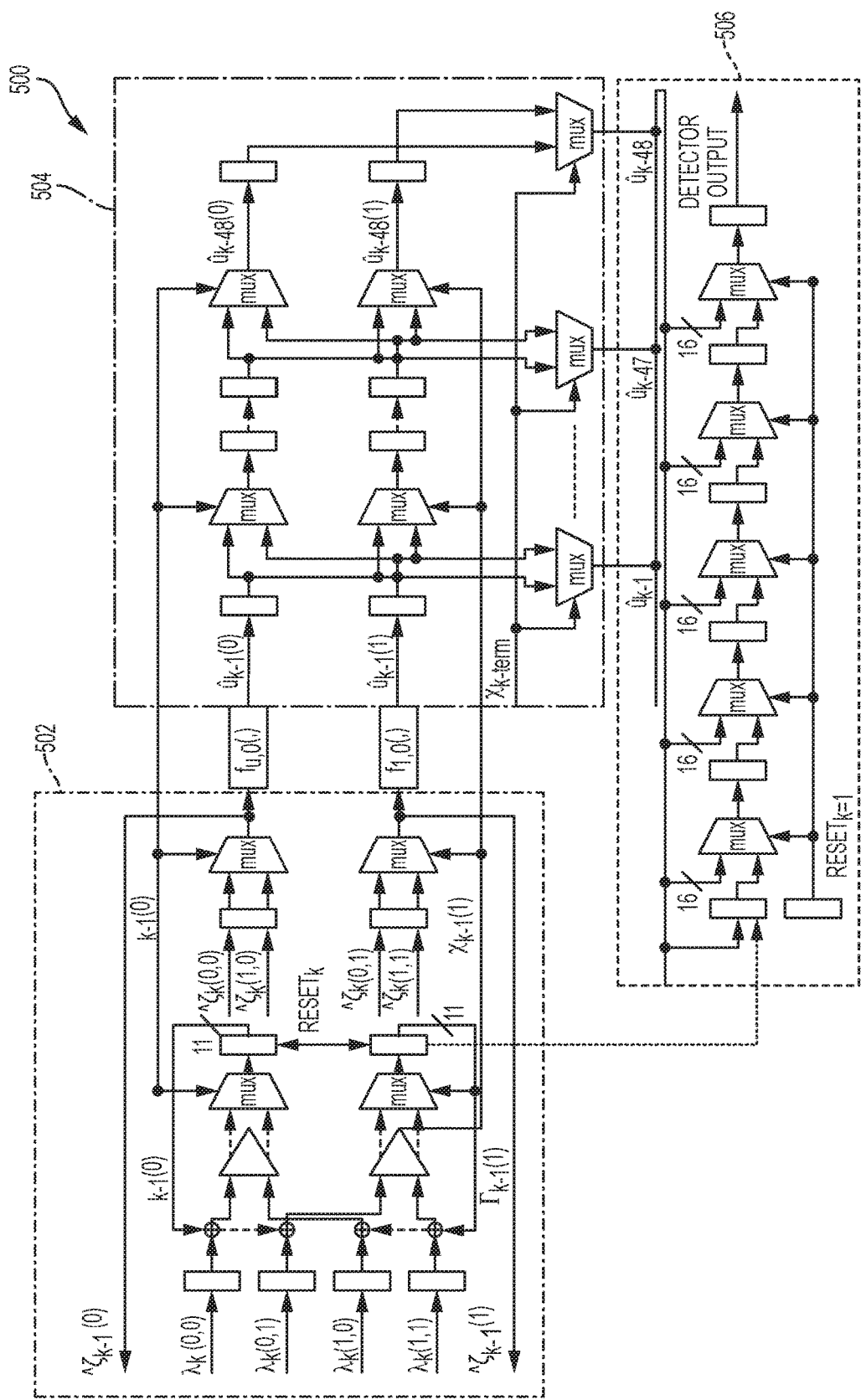

FIG. 5 shows a block diagram of an embodiment of portions of the Viterbi detector.

Figure 6:
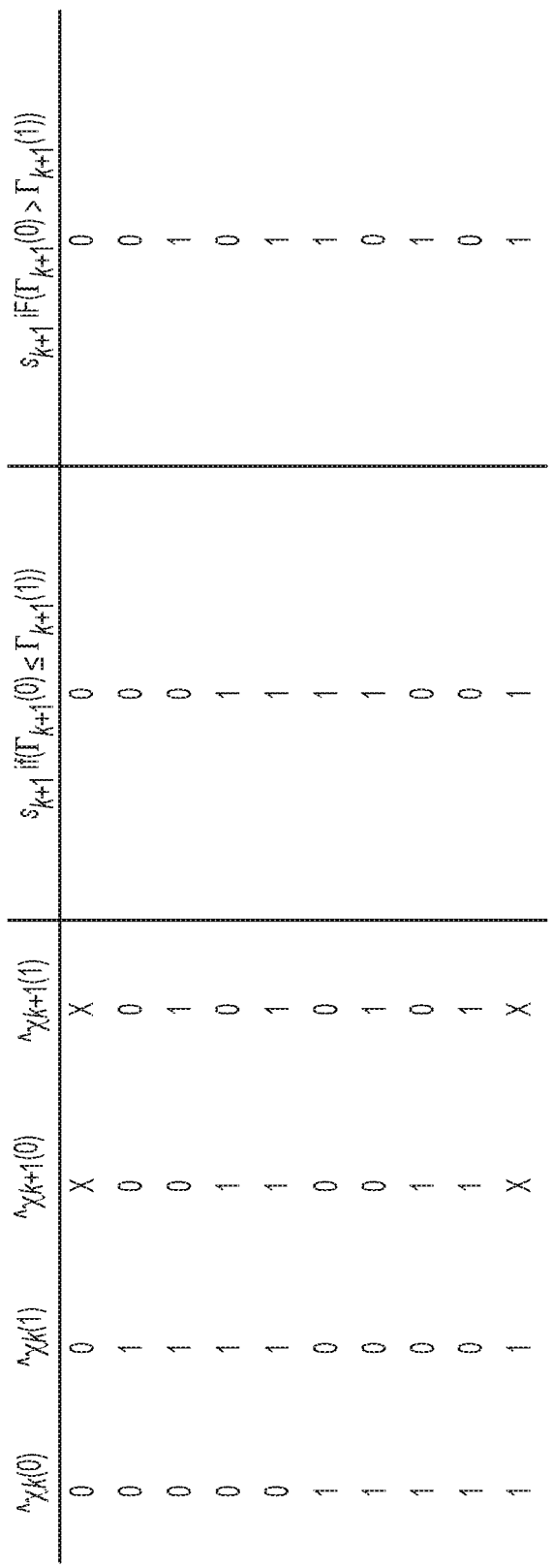

FIG. 6 shows a table for a calculation of the select signal sk generated by the Viterbi detector.

Figure 7:
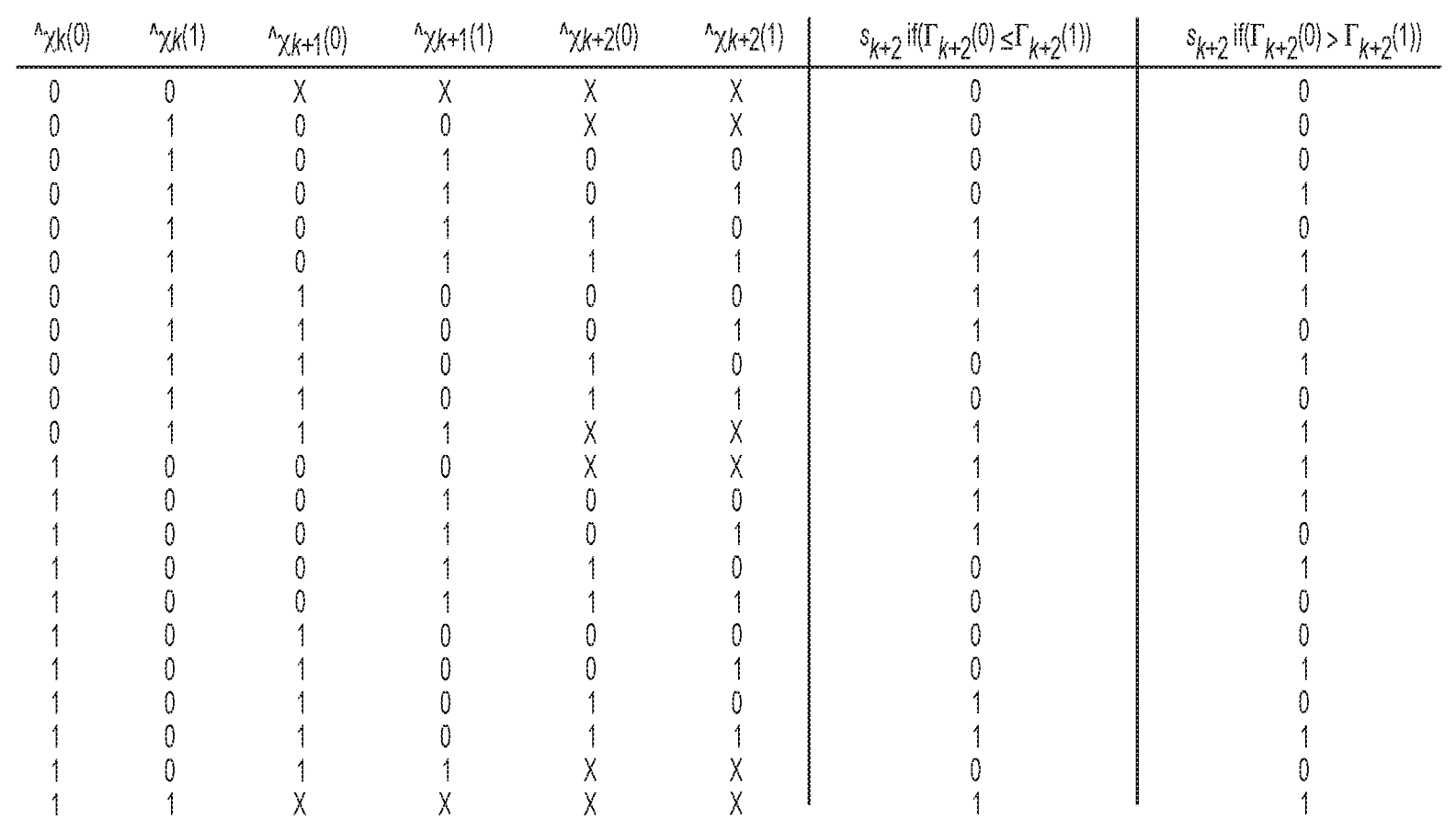

FIG. 7 shows an alternative table for a calculation of the select signal sk in case there are two register stages within the loop filter.

Figure 8:
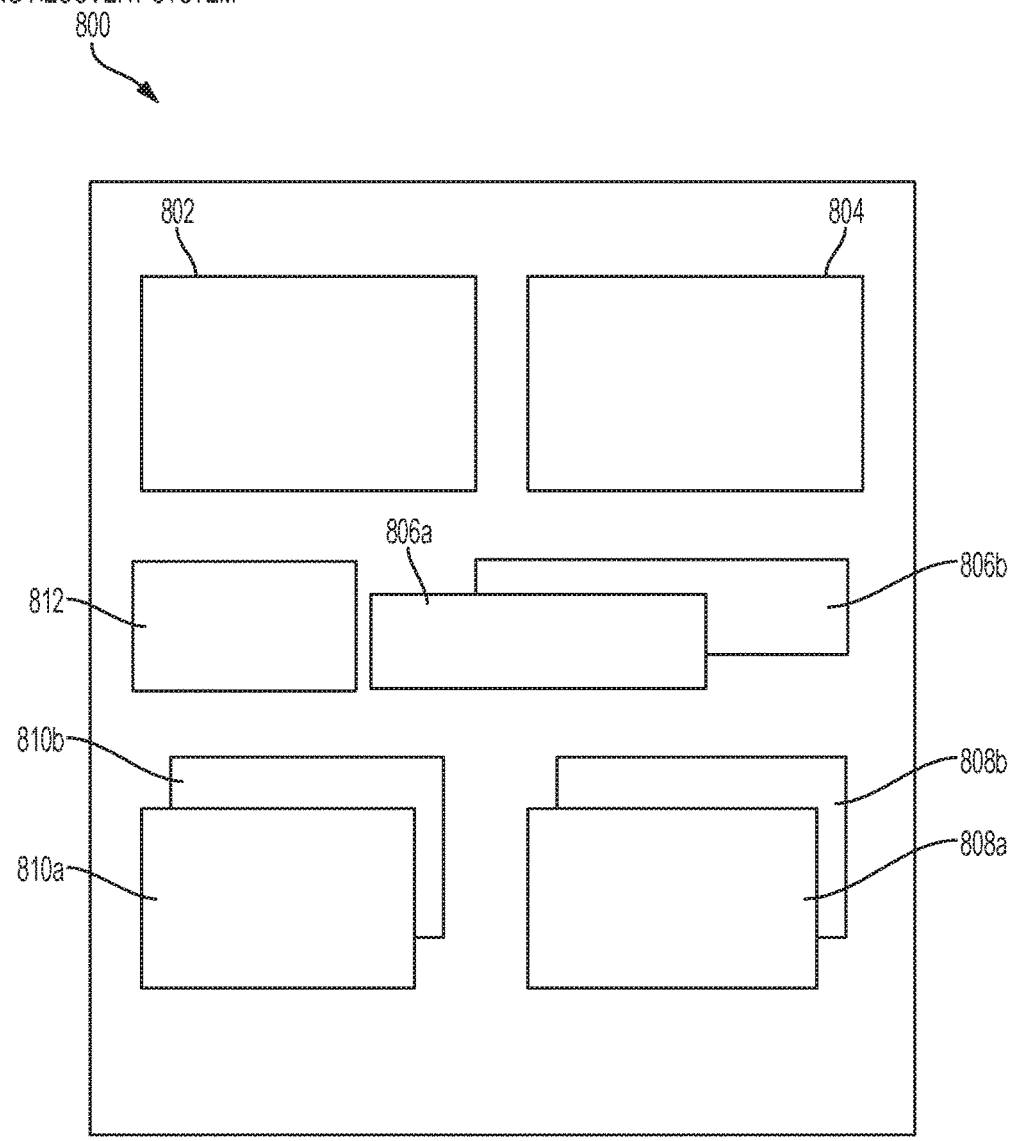

FIG. 8 shows a simplified overview block diagram of an embodiment of the timing recovery system.

Figure 9:
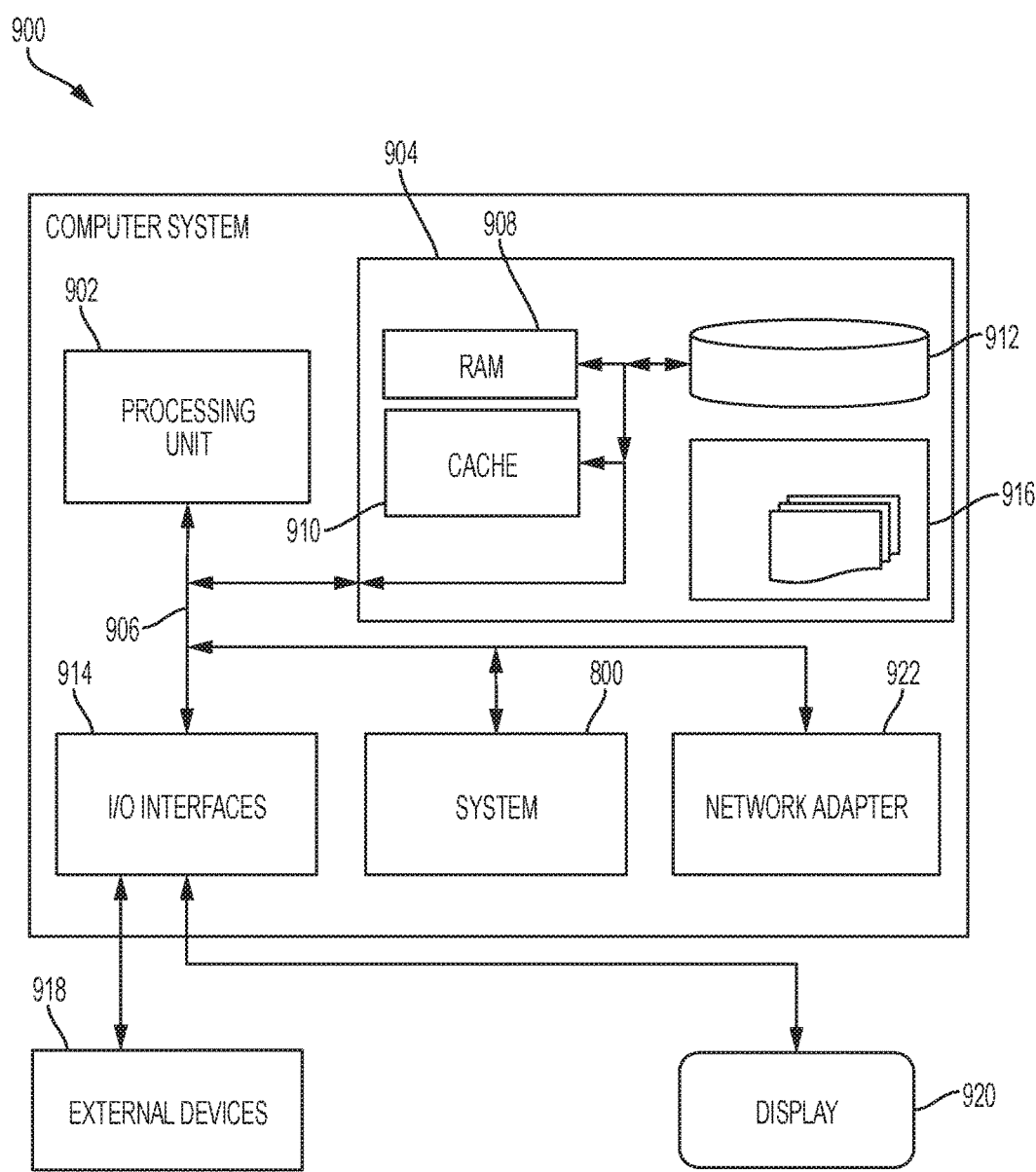

FIG. 9 shows a block diagram of the computer system with the timing recovery system included.

DETAILED DESCRIPTION

In the context of this description, the following conventions, terms and/or expressions may be used:

The term "timing recovery"—also denoted as clock recovery—may denote in serial communication of digital data, the process of extracting timing information from a serial input data stream for allowing the receiving circuit to decode the transmitted symbols. Timing recovery from the data stream is expedited by modifying the transmitted data. Wherever a serial communication channel does not transmit the clock signal along with the data stream, the clock must be regenerated at the receiver side, using the timing information from the data stream. Timing recovery is a common component of systems communicating over wires, optical fibers, or by radio, in general: communication links or communication channels.

The term "high-speed data transmission" may denote here serial communication speeds of up to e.g., 50 Gb/s, 100 Gb/s or even higher. Examples may be communication system using the IEEE 802.3bs standard (for e.g., 50 Gb/s or 100 Gb/s per channel), Fibre Channel 64GFC and 256GFCp, as well as, InfiniB and HDR. Also requirements for higher communication speeds may be addressable.

The term "analog input signal" may denote the signals coming to a receiver via a communication link/wire, etc. Typically, the analog input signal may be directed to an analog-to-digital converter (ADC).

The term "digital signal sample" may denote digital signals, i.e., parallel signals with a width of 8 bit, 16 bit or any other number of parallel bit lines. Digital signal samples may represent samples at the output port of the ADC.

The term "Viterbi detector" may denote a system adapted for executing the Viterbi algorithm for detecting sequence of symbols transmitted over transmission channels. The term "Viterbi decoder" may denote a system adapted for executing the Viterbi algorithm for decoding a bit-stream that has been encoded using convolutional code or trellis code. The Viterbi algorithm/detector is also used to estimate received (in data transmission) or read (in data storage) data sequences in the presence of intersymbol interference, i.e., the Viterbi algorithm/detector is also used independent of how the information is encoded. The Viterbi algorithm is the most resource-consuming algorithm (e.g. if compared to the Fano algorithm), but it implements the so-called maximum likelihood decoding. It is, for example, used for decoding convolutional codes with constraint lengths $k<=10$, but values up to $k=15$ are used in practice.

The term "timing error detector" may denote an electronic circuitry receiving as input a digital signal that is also input to a Viterbi detector, as well as, an output of the Viterbi detector. Thus, a timing difference between the clock used on the transmit side to generate the transmit signal and the clock on the receive side to derive received signal samples may be determined. More generally, a timing difference between the timing (phase) of the received signal and the clock phase on the receive side to derive received signal samples may be determined.

The term "loop filter" may denote an element of a timing recovery system that may generate an output signal that is related to the phase of a received signal. The loop filter may be an element of a phase-lock loop or phase-locked loop (PLL). The loop filter may generate a control signal that controls the phase and frequency of an oscillator, which outputs a clock signal that is provided to an ADC. There are several different types of timing recovery systems; the simplest is an electronic circuit consisting of a variable frequency oscillator and a phase detector in a feedback loop. The oscillator may generate a periodic signal, and the phase detector compares the phase of that signal with the phase of an input signal, adjusting the oscillator to keep the phases matched. Keeping the input and output phase in lock step may also imply keeping the input and output frequencies the same. Consequently, in addition to synchronizing signals, a phase-locked loop can track an input frequency, or it can generate a frequency that is a multiple of the input frequency. These properties are used for computer clock synchronization, demodulation, and frequency synthesis. Phase-locked loops are widely used to demodulate a signal, recover a signal from a noisy communication channel, generate a stable frequency at multiples of an input frequency (frequency synthesis), or distribute precisely timed clock pulses in digital logic circuits such as microprocessors. Since a single integrated circuit can provide a complete phase-locked-loop building block (and more), the technique is widely used in modern electronic devices with output frequencies from a fraction of a hertz up to many GHz.

The term "multiplexers" may denote a device that may select one of several digital input signals and forwards the selected input into a single signal. A multiplexer of 2n inputs may have n select lines, which may be used to select which input line should be sent to the output port. A multiplexer may also be used as a data selector. In the context of this document, the used multiplexers may be used to select one of two (or more) digital timing phase signals and/or two related digital frequency offset signals.

The term "select signal" may denote a binary signal selecting one out of two digital timing signals and/or digital frequency offset signals. It may also be noted that a binary signal may only assume 2 values, namely "1" and "0". In contrast, a digital signal may comprise a plurality of binary signals in parallel. If n binary lines may be present, 2n different values may be represented.

The term "sampling clock" may denote a clock used by an ADC to convert the analog input signal into a sequence of digital signals (represented by a plurality of parallel binary lines). The frequency of the sampling clock may represent the speed at which a new digital signal may be generated at the output of the ADC.

The term "pulse-amplitude modulation" (PAM) scheme may denote a form of signal modulation in which the message information is encoded in the amplitude of a sequence of signal pulses. The amplitude of a signal pulse is chosen from a finite symbol set, also called signal constellation. It may be an analog pulse modulation scheme in which the amplitudes of a train of carrier pulses are varied according to the sample value of the message signal. Demodulation may be performed by detecting the amplitude level of the carrier at every single period. Some versions of the Ethernet communication standard are an example of a PAM usage. In particular, 100BASE-T4 and BroadR-Reach Ethernet standard use three-level PAM modulation (PAM-3), 1000BASE-T Gigabit Ethernet uses a five-level PAM-5 modulation and 10GBASE-T 10 Gigabit Ethernet uses a Tomlinson-Harashima Precoded (THP) version of pulse-amplitude modulation with 16 discrete levels (PAM-16), encoded in a two-dimensional checkerboard pattern, known as DSQ128.

The term "timing phase signal" may denote a digital signal indicative of a symbol timing phase compared to a timing of a sequence of received signal samples.

The term "frequency offset signal" may denote a digital signal indicative of a difference between a symbol frequency compared to a frequency of a sequence of received signal samples.

The term "speculative tentative symbol decision" may denote a potentially detected symbol by the Viterbi detector. A tentative symbol decision may denote a candidate symbol for detection by the Viterbi detector. The here proposed system may use a set of two subsequent tentative symbol decisions and at a later time may select which set of the two may be the better one—here is where the term speculative comes in.

The term "candidate survivor state" may denote a potentially detected state of the Viterbi detector.

The term "metric" may denote a distance between a sequence of one or more received signal samples and a hypothesized sequence of one or more symbols that is allowed at the transmitter.

The proposed method for timing recovery for a high-speed data transmission system may offer multiple advantages and technical effects:

The method implementing a simple timing recovery based on speculative tentative symbol decisions helps to improve the reliability of symbol detection and to increase the transmission speed over a communication channel. A Viterbi detector combined with timing error detectors, loop filters and multiplexers enables an accurate adjustment of the sampling phase and frequency of the clock provided to the analog-to-digital converter at an input port of a related receiver system. It enables the generation of timing errors in the timing recovery loop with as little latency as possible. Based on this minimal latency for the adjustment of the ADC clock, more accurate timing and as a consequence, a higher communication speed becomes possible.

A further advantage of the improved timing recovery method described here is a reduction in user bit error rate. Improving the timing recovery loop by reducing the latency in the timing recovery loop leads to more accurate sampling instances of the received signal in the presence of changes in the timing (phase) of the received signal leading to a lower bit error rate at the output of the Viterbi detector. A lower bit error rate at the output of the Viterbi detector leads to a significantly lower user bit error rate at the output of an error-correction decoder, which follows the Viterbi detector, assuming the transmitted or stored data has been encoded by an error correction code.

In the following, additional embodiments of the proposed method—also applicable to the related system—will be disclosed:

According to an optional embodiment of the method, the analog input signal may comprise signals based on a pulse-amplitude modulation scheme, e.g., PAM-2, PAM-4 or other modulation schemes. For example, the PAM-4 is a modulation technique, wherein 4 distinct pulse amplitudes are used to convey the information. Amplitude levels 1, 2, 3, and 4 are represented by two bits 00, 01, 11, and 10, respectively. Each pair of bits is called a "symbol". When one of the four amplitudes is transmitted in a symbol period, there are two bits transmitted in parallel, therefore the data rate is doubled compared to a PAM-2 scheme. In other words, PAM-4 modulation is twice as bandwidth-efficient as conventional binary modulation.

According to one advantageous embodiment of the method, each of the loop filters may generate a timing phase signal. This may be measured relative to the analog-to-digital converter clock, e.g. in a first order filter. Furthermore, according to another advantageous embodiment of the method, each of the loop filters may generate a frequency offset signal. Also, this may be measured relative to the analog-to-digital converter clock. For this embodiment, the filter may need to be a 2nd order filter. Such a filter may also generate the timing phase signal. A skilled person may know that a second order filter may generate both, the timing phase signal and the frequency offset signal.

According to one permissive embodiment of the method, each of said loop filters generates a timing phase signal and each of said loop filters generates a frequency offset signal, wherein the method also comprises also feeding a selected timing phase signal and a selected frequency offset signal back to a respective input port of at least one loop filter. The feedback of the "winning" outputs of the multiplexers (i.e., selected by sk) back to the loop filters is a substantial feature because it ensures a proper functioning of the loop filters, i.e., use of the correct (previous) phase and frequency offset estimates.

According to embodiments of the invention, the method may also comprise using two loop filters, and determining the timing phase τk, as $$\tau_k = \tau_{k-1} + \gamma^* \Delta\tau_{k-1}, \text{ wherein}$$

γ is a loop gain factor of the loop filter. In compliance with the remarks above, only a first order filter would be required for that.

According to embodiments of the invention, the method may also comprise using at least two loop filters, and determining the timing phase $\tau_k$ and the frequency offset $\Delta T_k$. The frequency offset $\Delta T_k$ may compensate a difference between a modulation rate of the received signals—in particular at an input por—and a frequency of the sampling clock of the analog-to digital converter, as $$\tau_k = \tau_{k-1} + \gamma^* \Delta\tau_{k-1} + \Delta T_{k-1} + \zeta^* \Delta\tau_{k-1}, \text{ and}$$

$$\Delta T_k = \Delta T_{k-1} + \zeta^* \Delta\tau_{k-1}, \text{ wherein}$$

γ, ζ are loop gain factors. The loop gain factors are loop filter parameters, usually called loop gain factors.

According to a further embodiment of the method, a signal relating to the timing phase may be used for controlling a voltage controlled oscillator or a digitally controlled oscillator. Both types of oscillators may work and may be used. For the functioning of the method and the related system it does not make a difference. Depending on the implementation of the related timing recovery system, a digitally controlled oscillator may be more appropriate. A selection of the type of oscillator—in particular voltage controlled or digitally controlled—may be independent from the type of filter—in particular first order or second order—used.

According to a further advantageous embodiment, the method may also comprise using two subsequent candidate symbols, and determining the timing error $\Delta\tau k-1$ by one of the error detectors as $$\Delta\tau_{k-1} = -z_{k-1} * \hat{u}_{k-2} + z_{k-2} * \hat{u}_{k-1}, \text{ wherein}$$

$z_i$ is a received signal sample with index i—i.e., an output of the analog-to-digital converter,
$\hat{u}_i$, is a speculative tentative symbol decision with index i output by the Viterbi detector.

It may be mentioned that the first term of the equation may be sufficient to make the method (and the related system) work. However, the equation above suggests to use two consecutive tentative symbol decisions (with index k−1 and k−2). Thus, both sets would have two tentative symbol decisions.

It may also be noted that z and u are unit-less; z is an analog-to-digital converter output sample and û is a tentative symbol decision; a multiplication with filter parameters may then deliver the correct units.

According to another optional embodiment, the method may also comprise using two error detectors, and determining two speculative timing error signals of the two error detectors as $$\Delta\tau_{k-1,1} = -z_{k-1} * \hat{u}_{k-2,1} + z_{k-2} * \hat{u}_{k-1,1}$$

$$\Delta\tau_{k-1,2} = -z_{k-1} * \hat{u}_{k-2,2} + z_{k-2} * \hat{u}_{k-1,2}, \text{ wherein}$$

$z_i$ is the signal sample with index i (again an output of the analog-to-digital converter), and
$\Delta\tau_{k,y}$ is a timing error with index k provided by one of the timing error detectors, $y \in \{1,2\}$. Such an implementation may generate high-quality timing signals also for a high transmission speed.

According to embodiments of the invention, and assuming that the loop filter is not causing any additional delays—also for consistency reasons—the method may also comprise determining the select signal of the Viterbi detector by $$s_k = \hat{\chi}_k(\operatorname{argmin}_{\chi_k} \Gamma_k(\chi_k)), \text{ wherein}$$

$s_k$ = select signal with index k,
$\hat{\chi}_k$ is a candidate survivor state in the Viterbi detector with index k, and
$\Gamma_k(\chi_k)$ is a metric associated with the survivor state $\chi_k$ with index k of the Viterbi detector. More details, as well as related states, will be described below as part of the figures.

In the following, a detailed description of the figures will be given. All instructions in the figures are schematic. Firstly, a block diagram of an embodiment of the inventive method for timing recovery for a high-speed data transmission system is given. Afterwards, further embodiments, as well as embodiments of the timing recovery system for a high-speed data transmission system, will be described.

FIG. 1 shows a block diagram of an embodiment of the method 100 for timing recovery for a high-speed data transmission system. The method 100 comprises receiving, 102, an analog input signal—in particular, coming in an analog form via a communication channel—at an analog-to-digital converter. The converter may convert an analog signal, e.g., into an 8-bit or 16-bit signal sample; any numbers of bits are also possible.

Furthermore, the method 100 comprises passing, 104, processed digital signal samples to a Viterbi detector. The processing may be done (a) by the ADC (analog-to-digital converter) and (b) optionally by DSP (digital signal processing), e.g., a digital equalizer between the ADC and the Viterbi detector. As known from traditional technology, the Viterbi detector may comprise a branch-metric unit (BMU), a path-metric unit (PMU), and a survivor-metric unit (SMU).

Additionally, the method 100 comprises receiving, 106, at least one—typically, two in general sequence—processed signal sample and at least two sets of at least one candidate symbol, each from at least one selected out of the Viterbi detector, and the processed signal samples by timing error detectors. Typically, an implementation comprises at least two timing error detectors. Also, typically, there are two sets of speculative tentative symbol decisions, i.e., four symbols in total processed at the same time by the two timing error detectors.

It may be noted that the timing error detectors are independent from each other and operate in parallel.

Moreover, the method 100 comprises forwarding, 108, digital output signals—in particular timing error terms—of the timing error detectors via loop filters to related multiplexers. The loop filters may be of first or of second order.

Additionally, the method 100 comprises selecting, 110, one digital signal—in particular out of the first set and the second set of speculative tentative symbol decisions—from each of the multiplexers using a select signal generated by the Viterbi detector—in particular by the path-metric unit of the Viterbi detector.

Last but not least, the method 100 comprises deriving, 112, a control signal for controlling a sampling clock of the analog-to-digital converter by at least one of the selected digital signals—in particular the timing phase output—from the multiplexers. The sampling clock of the ADC may be generated by a digitally controlled oscillator or by a voltage controlled oscillator.

FIG. 2 shows a block diagram of an embodiment of the inventive timing recovery system 200 relating to the just described method 100. A signal 202 is received from a communication link or communication channel (not shown) at ADC 204. Optionally, a DSP circuit 206—e.g., a digital equalizer—may process the sequence of signal samples received from the output of the ADC 204 before receiving the input signal zk at the Viterbi detector 210 (described below).

Tentative symbol decision pairs (a) {ûk−1,1, ûk−2,1} (reference numeral 212) and (b) {ûk−1,1, ûk−2,1} (reference numeral 214) are used as input values to the timing error detectors 216 and 218. As may be noted from the figure, also signals derived from the input signal zk (alternatively also another output signal from the DSP circuit 206) may be used as input signals for the timing error detectors 216, 218. This is shown as a signal path via the registers 220 and 222. The timing error detectors 216, 218 comprise each at least two multipliers 224, 226, and an adder 228, which output signal represents a respective timing error, namely timing errork−1,1 229 and timing errork−1,2 231.

These timing error terms are forwarded to the loop filters 230, 232 which can generate a set of a timing phase signal timing-phasek,1 234 and a frequency offset signal frequency-offsetk,1 236 and a second set of a timing phase signal timing-phasek,2 238 and a frequency offset signal frequency-offsetk,2 240. Via an intermediate storage or register 242, the signals are forwarded to multiplexers 244 and 246. In such a way, the timing phase signals are input to one multiplexer and the frequency offset signals are input to the other multiplexer. As can also be seen, the output signals 248, 250 of the multiplexers 244, 246 are fed back to the loop filters 230, 232.

The decision which of the two input signals—which are understood to be parallel signals—will pass through each of the multiplexers depends on a select signal sk 252 generated by the Viterbi detector 210—in particular by the path-metric unit of the Viterbi detector.

The output of the multiplexer 244—relating to the timing phase signals 234, 238—and the output of the multiplexer 246—relating to the frequency offset signals 236, 240, will be used as input signals 248 (equivalent to signal on line 254) and 250 (equivalent to signal on line 255), respectively, to control a controllable oscillator 256—either voltage controlled oscillator or digitally controlled oscillator—which generates the sampling clock 258 of the ADC. This way, the loop is closed such that an optimized timing signal for sampling of the incoming signals may be derived.

FIG. 3 shows a block diagram of a Viterbi detector 300. It may be assumed that the general function of a Viterbi detector may be known to a skilled person. Based on an input signal vector h 304, a hypothesized value generator 302 calculates the hypothesized input values ~yk and outputs these to the branch-metric unit 306. The branch metric unit 306 receives the hypothesized input values ~yk and processed signal samples yk=zk, and computes the branch metrics ζk and the unresolved subset decisions ζ̃k that are provided to the path-metric unit 308. The vectors ^χk−1 (state vector), the tentative symbol decisions ^uk−1 and the unresolved subset decisions ζ̃k are fed back as shown. The survivor-memory unit 310 receives the vectors ^χk−1 and the tentative symbol decisions ^uk−1 and finally delivers one of the output values 312 of the Viterbi detector 300.

It may be noted that the Viterbi algorithm is highly suitable for high speed data transmission systems. While a maximum-likelihood sequence detector (MLSD) realizing the Viterbi algorithm is widely used for low-symbol-rate communication systems, the implementation complexity of an MLSD may be prohibitive for serial links operating at gigaBaud symbol rates because design specification regarding area, latency, power consumption, and speed may not be satisfied concurrently. Instead, sub-optimal solutions such as feed-forward equalizers and decision-feedback equalizers may often be chosen for high-speed serial links because of their lower implementation complexity.

A reduced-state sequence detector (RSSD) reduces the implementation complexity of the MLSD with negligible performance degradation by exploiting set-partitioning principles and embedded per-supervisor decision feedback. The RSSD may also be viewed as a general form of delayed decision-feedback sequence detection, which uses embedded per-survivor decision feedback without set partitioning. Thus, a sliding-block Viterbi detector breaks the speed bottle-neck in sequence-decoder implementations by applying the Viterbi algorithm to the sliding-block decoder. Compared with the sliding-block solution, a systolic-array solution formulates the non-linear add-compare-select loop of the Viterbi algorithm as a linear vector recursion to achieve parallelized operation of the Viterbi algorithm, thereby avoiding the overhead caused by the synchronization length used for block initialization. The result of both of these approaches is that a sequence detector or decoder can be implemented at any speed provided that the required area, latency, and power consumption is acceptable. The design challenge then lies in satisfying concurrently, the specifications regarding area, latency, and power consumption at the target speed.

FIG. 4 shows a block diagram of an embodiment of the general architecture 400 used for the implementation of the Viterbi detector. It includes a pseudo-random binary sequence (PRBS) generator 402, channel emulator 404, eighth-rate sliding-block Viterbi detector 406, and PRBS checker 408.

All logic circuits receive an eighth-rate (c8) clock signal (lower left corner). The PRBS generator 402 outputs 16 input bits in the kth c8 clock period, which are mapped to eight input symbols {uk,1, uk,2, . . . , uk,8} drawn from a PAM-4 signal constellation A. A substate χk in a reduced-state subset trellis is defined as the subset Ǎk−1 ∈ {A 0, A 1} to which the information symbol uk−1 belongs. For example, when the information symbol uk−1 is in the subset A 0, one represents the substate χk by 0. Similarly, when the information symbol uk−1 is in the subset A 1, one represents the substate χk by 1. By the same notation, an information symbol uk is represented by its index in the signal constellation A : uk ∈ {0, 1, 2, 3}. For example, when the information symbol uk−1 is −3, then one represents the information symbol uk−1 by 0. The PRBS generator 402 also outputs the termination substate χk−1, term, which represents the substate to which the information symbol uk,8 belongs, where 1 is the latency from the output of the PRBS generator 402 to the input of the RSSDs 414.

A channel emulator 404 convolves the sequence of symbols {uk} with the assumed discrete-time impulse-response sequence vector h=(h0, h1, h2, h3) (ref.-num. 410), where, without loss of generality, the main-cursor channel coefficient h0 is normalized to 1. A reduced-rate implementation of the RSSD 414 is needed to reach the target data rates due to electro-migration concerns and the limitations on the maximum clock frequency of a 14-nm CMOS technology and its digital-design flow. An 8th-rate implementation can be chosen because its higher rate counterparts could not reach the target data rates, and its lower rate counterparts would introduce more latency and occupy more area.

The 8th-rate Viterbi detector 406 comprises a synchronizer 418, a serial-to-block converter 412, parallel RSSDs 414, a register array 420, and a block-to-serial converter 416. The synchronizer 418 is a state-machine that organizes the data-flow within the Viterbi detector 406. It takes as inputs the termination substate χk−1, term to output it after 1 c8 clock periods and the signal "mode" that determines the synchronization length α ∈ {0, 24} for initialization and the number of RSSDs operating in parallel. When the synchronization length α is 0, then the number of RSSDs operating in parallel is 8 because the Viterbi detector 406 operates at one-eighth of the modulation rate.

When the synchronization length α is 24, then the number of RSSDs operating in parallel is 12, due to the resulting 50% overhead of information symbols, as the termination block length is 48 symbols. The serial-to-block converter 412, controlled by the signal "flag_vmux" 422, distributes the "serial" channel-output signals to the RSSDs 414. It receives 8 input signals per c8 clock period, but outputs only one of them to an RSSD 414. The block-to-serial converter 416, controlled by the signal "flag_vdemux" 424, reorganizes the termination blocks such that they can be output "serially" to the PRBS checker 408 used as the error counter. The register array 420 stores the discrete-time impulse-response sequence vector h 410, pre-computed partial hypothesized input value vectors yk", and the signal "mode".

FIG. 5 shows a block diagram of an embodiment of portions of the Viterbi detector, in particular the path-metric unit 502, the survivor memory unit 504, as well as, an output stage 506. Because the basic elements of the Viterbi detectors are well known emphasis may be directed to differences to the state-of-the-art Viterbi detectors.

A new pipelined reduced-state sliding-block Viterbi detector is introduced with an architecture designed to satisfy concurrently the desired design specifications for high-speed serial chip-to-chip links. The new algorithm computes partial path metrics by reducing to one the number of additions in the longest path. Furthermore, a novel speculative symbol timing recovery scheme is proposed to reduce the latency in the timing-recovery loop, as can be derived from FIGS. 4 and 5. It may enable a concatenated RS (Reed-Solomon) coding and 4-D (four dimensional) 5-PAM TCM (Trellis Coded Modulation) scheme having the potential for being used in future Ethernet standards. An adapted TCM decoder architecture for high-speed implementations of the considered coding scheme becomes possible based on a modified branch-metric unit and a modified path-metric unit. The branch-metric unit does not require as many comparators as in conventional designs, whereas the path-metric unit accounts for a pipeline stage to reduce the propagation delay of the longest path.

The path-metric unit 502 computes the path-metric $\Gamma k(\chi k)$ to make substate decisions $\hat{\chi} k$ and symbol decisions $\hat{u}k$. The path metrics $\Gamma k(\chi k)$ are the accumulation of branch metrics of a path in the trellis. The substate is detected from the comparison between its respective partial path metrics as $\hat{\chi}k=\arg\min_{\chi k} \Gamma k(\chi k, \chi k+1)$. One of the partial path metrics $\Gamma k(\chi 0, \chi k+1)=\Gamma k(\chi k)+\lambda k(\chi k, \chi k+1)$ becomes the respective path metric depending on the detected substate $\hat{\chi}k-1(\chi k)$:

$$\Gamma k+1(\chi k+1)=\min_{\chi k}\Gamma k(\chi k, \chi k+1).$$

The detected substate $\chi k$ also chooses its respective resolved subset decision $\hat{\hat{A}}k(\chi k)$ out of the unresolved subset decisions $\hat{\in}k(\chi k, \chi k+1)$. The resolved subset decision $\hat{Å}k(\chi k)=\min uk \in \hat{Å}k\, çk(\chi k, \chi k+1)$ is then mapped to a symbol decision $\hat{u}k\,(\chi k)$ by the symbol-mapper functions that bear the set-partitioning information $fu,0()$ and $fu,1(.)$: $fu,0(\hat{Å}k-1(0))=\hat{u}k-1(0);\ fu,1(\hat{Å}k-1(1))=\hat{u}k-1(1)$. The branch metrics and corresponding path metrics are calculated in subsequent c8 clock periods, thus reducing the number of additions in the longest path to one, when h2=h3=0. The "resetk" signal resets the path metrics at the end of a termination block, so that the incoming termination block can be processed without bias from the current termination block.

The SMU 504 is represented in the top right corner of FIG. 5. Register-exchange method (compare: S. B. Wicker, Error Control Systems for Digital Communication and Storage, Englewood Cliffs, N.J.; Prentice-Hall, 1995) is used as the memory-organization technique, and the traceback method could as well be used in this architecture when h2≠0 and h3≠0. The termination substate $\chi k$,term determines which of the two competing survivor paths succeeds in being the survivor sequence. The top right circuitry 504 (SMU=survivor memory path) stores the survivor paths, whereas the output stage 506 chooses and outputs the survivor sequence. The "resetk−1" signal is asserted when the last termination symbol of a termination block is processed for the survivor sequence to be retrieved from the SMU. The detector then outputs 8 symbols, which correspond to 16 bits, per c8 clock period to match the speed of the PRBS checker.

FIG. 6 shows a table for a calculation of the select signal sk generated by the Viterbi detector for the case one register stage is included in the loop filter. Consequently, the select signal sk can be calculated as a simple logic function:

$$s_{k+1}=(\neg \hat{\ }\chi_{k+1}(\mathrm{argmin}_{\chi k+1}\Gamma_k(\chi_{k+1}))/\wedge\hat{\ }\chi_k((0))/\wedge(\hat{\ }\chi_{k+1} (\mathrm{argmin}_{\chi k+1}\Gamma_k(\chi_{k+1}))/\wedge\hat{\ }\chi_k \quad (1)).$$

FIG. 7 shows an alternative table for a calculation of the select signal sk in case there are two register stages within the loop filter. The following logic function can then be derived from the table:

$$s_{k+1}=(\hat{\ }\chi_{k+2}(\mathrm{argmin}_{\chi k+2}\Gamma_{k+2}(\chi_{k+2}))/\wedge\hat{\ }\chi_{k+1}(1)/\wedge\hat{\ }\chi_k(1)))$$
$$\vee(\hat{\ }\chi_{k+2}(\mathrm{argmin}_{\chi k+2}\Gamma_{k+2}(\chi_{k+2}))$$
$$\wedge\neg\hat{\ }\chi_{k+1}(1)/\wedge\chi_k((0)))$$
$$\vee(\neg\hat{\ }\chi_{k+2}(\mathrm{argmin}_{\chi k+2}\Gamma_{k+2}(\chi_{k+2}))/\wedge\hat{\ }\chi_{k+1}(0)/\wedge\hat{\ }\chi_k ((1)))\vee$$
$$(\neg\hat{\ }\chi_{k+2}(\mathrm{argmin}_{\chi k+2}\Gamma_{k+2}(\chi_{k+2}))$$
$$\wedge\neg\hat{\ }\chi_{k+1}(0)/\wedge\chi_{k+1}(0))).$$

FIG. 8 shows a simplified overview block diagram of an embodiment of the timing recovery system 800. The timing recovery system 800 comprises an analog-to-digital converter 802 adapted for receiving an analog input signal, a Viterbi detector 804 adapted for receiving processed digital signal samples, and timing error detectors 806a, 806b adapted for receiving at least one processed signal sample and at least two sets of at least one candidate symbol each from at least one selected out of the Viterbi detector, and the processed signal samples.

The timing recovery system 800 comprises also loop filters 808a, 808b relating to output signals of the timing error detectors 806a, 806b and multiplexers 810a, 810b relating to the loop filters 808a, 808b. Thereby, the Viterbi detector 804 is adapted for generating a select signal sk adapted for selecting one digital signal from each of the multiplexers 810a, 810b. Furthermore, the timing recovery system 800 comprises an adjustable oscillator 812 adapted for deriving a sampling clock signal of the analog-to-digital converter 802 controlled by at least one of the selected digital signals from the multiplexers.

Embodiments of the invention may be implemented together with virtually any type of computer, regardless of the platform being suitable for storing and/or executing program code. FIG. 9 shows, as an example, a computing system 900 suitable for executing program code related to the proposed method.

The computing system 900 is only one example of a suitable computer system and is not intended to suggest any limitation as to the scope of use or functionality of embodiments of the invention described herein, regardless, whether the computer system 900 is capable of being implemented and/or performing any of the functionality set forth hereinabove. In the computer system 900, there are components, which are operational with numerous other general purpose or special purpose computing system environments or configurations. Examples of well-known computing systems, environments, and/or configurations that may be suitable for use with computer system/server 900 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like. Computer system/server 900 may be described in the general context of computer system-executable instructions, such as program modules, being executed by a computer system 900. Generally, program modules may include routines, programs, objects, components, logic, data structures, and so on that perform particular tasks or implement particular abstract data types. Computer system/server 900 may be practiced in distributed cloud computing environments where tasks are performed by remote processing devices that are linked through a communications network. In a distributed cloud computing environment, program modules may be located in both, local and remote computer system storage media including memory storage devices.

As shown in the figure, computer system/server 900 is shown in the form of a general-purpose computing device. The components of computer system/server 900 may include, but are not limited to, one or more processors or processing units 902, a system memory 904, and a bus 906 that couple various system components including system memory 904 to the processor 902. Bus 906 represents one or more of any of several types of bus structures, including a memory bus or memory controller, a peripheral bus, an accelerated graphics port, and a processor or local bus using any of a variety of bus architectures. By way of example, and not limiting, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. Computer system/server 900 typically includes a variety of computer system readable media. Such media may be any available media that is accessible by computer system/server 900, and it includes both, volatile and non-volatile media, removable and non-removable media.

The system memory 904 may include computer system readable media in the form of volatile memory, such as random access memory (RAM) 908 and/or cache memory 910. Computer system/server 900 may further include other removable/non-removable, volatile/non-volatile computer system storage media. By way of example only, a storage system 912 may be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media may be provided. In such instances, each can be connected to bus 906 by one or more data media interfaces. As will be further depicted and described below, memory 904 may include at least one program product having a set (e.g., at least one) of program modules that are configured to carry out the functions of embodiments of the invention.

The program/utility, having a set (at least one) of program modules 916, may be stored in memory 904 by way of example, and not limiting, as well as an operating system, one or more application programs, other program modules, and program data. Each of the operating systems, one or more application programs, other program modules, and program data or some combination thereof, may include an implementation of a networking environment. Program modules 916 generally carry out the functions and/or methodologies of embodiments of the invention, as described herein.

The computer system/server 900 may also communicate with one or more external devices 918 such as a keyboard, a pointing device, a display 920, etc.; one or more devices that enable a user to interact with computer system/server 900; and/or any devices (e.g., network card, modem, etc.) that enable computer system/server 900 to communicate with one or more other computing devices. Such communication can occur via Input/Output (I/O) interfaces 914. Still yet, computer system/server 900 may communicate with one or more networks such as a local area network (LAN), a general wide area network (WAN), and/or a public network (e.g., the Internet) via network adapter 922. As depicted, network adapter 922 may communicate with the other components of computer system/server 900 via bus 906. It should be understood that although not shown, other hardware and/or software components could be used in conjunction with computer system/server 900. Examples, include, but are not limited to: microcode, device drivers, redundant processing units, external disk drive arrays, RAID systems, tape drives, and data archival storage systems, etc.

Additionally, timing recovery system 800 for a high-speed data transmission system be attached to the bus system 906.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present invention may be embodied as a system, a method, and/or a computer program product. The computer program product may include a computer readable storage medium (or media) having computer readable program instructions thereon for causing a processor to carry out aspects of the present invention.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer readable program instructions may execute entirely on the user's computer, partly on the user's computer as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus", and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus", or another devices to cause a series of operational steps to be performed on the computer, other programmable apparatus or other device to produce a computer implemented process, such that the instructions which execute on the computer, other programmable apparatus", or another device implement the functions/acts specified in the flowchart and/or block diagram block or blocks.

The flowcharts and/or block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A method for timing recovery for a high-speed data transmission system, said method comprising:
   receiving an analog input signal at an analog-to-digital converter;
   passing processed digital signal samples to a Viterbi detector;
   receiving, using timing error detectors, at least one processed signal sample and at least two sets of at least one candidate symbol, each of which is from at least one selected output of said Viterbi detector and said processed signal samples;
   forwarding output digital signals of said timing error detectors via loop filters to related multiplexers;
   selecting one digital signal from each of said multiplexers using a select signal generated by said Viterbi detector; and
   deriving a control signal controlling a sampling clock of said analog-to-digital converter by at least one of said selected digital signals from said multiplexers.

2. The method according to claim 1, wherein said analog input signal comprises signals based on a pulse-amplitude modulation scheme.

3. The method according to claim 1, wherein each of said loop filters generates a timing phase signal and/or wherein each of said loop filters generates a frequency offset signal.

4. The method according to claim 1, wherein each of said loop filters generates a timing phase signal and wherein each of said loop filters generates a frequency offset signal, wherein the method also comprises:
   feeding a selected timing phase signal and a selected frequency offset signal back to a respective input port of at least one loop filter.

5. The method according to claim 3 further comprising:
   using two loop filters; and
   determining said timing phase $T_k$ as $\tau_k = \tau_{k-1} + \gamma \ast \Delta\tau_{k-1}$, wherein:

$\gamma$ is a loop gain factor; and
   $\Delta\tau_{k-1}$ is a timing error.

6. The method according to claim 3 further comprising:
   using at least two loop filters; and
   determining said timing phase $\tau_k$ and said frequency offset $\Delta T_k$, said frequency offset $\Delta T_k$ compensating a difference between a modulation rate of said received signals and a frequency of said sampling clock of said analog-to-digital converter, as $\tau_k = \tau_{k-1} + \gamma \ast \Delta\tau_{k-1} + \Delta T_{k-1} + \zeta \ast \Delta\tau_{k-1}$, and $\Delta T_k = \Delta T_{k-1} + \zeta \ast \Delta\tau_{k-1}$, wherein:

$\gamma$, $\zeta$ are loop gain factors.

7. The method according to claim 3, wherein a signal relating to said timing phase is used for controlling a voltage controlled oscillator or a digitally controlled oscillator.

8. The method according to claim 1 further comprising:
   using two subsequent candidate symbols; and
   determining a timing error $\Delta\tau_{k-1}$ by one of said error detectors as:

$\Delta\tau_{k-1} = -z_{k-1} \ast \hat{u}_{k-2} + z_{k-2} \ast \hat{u}_{k-1}$, wherein:

$z_i$ is a received signal sample with index i;
   $\hat{u}_i$ is a speculative tentative symbol decision with index i output by said Viterbi detector.

9. The method according to claim 6 further comprising:
   using two timing error detectors; and
   determining two speculative error signals of said two timing error detectors as:

$\Delta\tau_{k-1,1} = -z_{k-1} \ast \hat{u}_{k-2,1} + z_{k-2} \ast \hat{u}_{k-1,1}$ $\Delta\tau_{k-1,2} = -z_{k-1} \ast \hat{u}_{k-2,2} + z_{k-2} \ast \hat{u}_{k-1,2}$, wherein:

$z_i$ is said signal sample with index i; and
   $\Delta\tau_{k,y}$ is a timing error with index k provided by one of said timing error detectors, $y \in \{1,2\}$.

10. The method according to claim 1 further comprising:
    determining, upon said loop filter not causing any additional delay, said select signal of said Viterbi detector by:

$s_k = \hat{\chi}_k(\mathrm{argmin}_{\chi_k} \Gamma_k(\chi_k))$, wherein:

$s_k$ = select signal with index k;
    $\hat{\chi}_k$ is a candidate survivor state in said Viterbi detector with index k; and
    $\Gamma_k(\chi_k)$ is a metric associated with said survivor state $\chi_k$ with index k.

11. A timing recovery system for high-speed data transmissions, said system comprising:
    an analog-to-digital converter adapted for receiving an analog input signal;
    a Viterbi detector adapted for receiving processed digital signal samples;
    timing error detectors adapted for receiving at least one processed signal sample and at least two sets of at least one candidate symbol, each from at least one selected out of said Viterbi detector, and said processed signal samples;
    loop filters relating to output signals of said timing error detectors;
    multiplexers relating to said loop filters;
    wherein said Viterbi detector is adapted for generating a select signal adapted for selecting one digital signal from each of said multiplexers; and
    an adjustable oscillator adapted for deriving a sampling clock signal of said analog-to-digital converter by said one of said selected digital signals from said multiplexers.

12. The system according to claim 11, wherein said input analog signal comprises signals based on a pulse-amplitude modulation scheme.

13. The system according to claim 11, wherein each of said loop filters is adapted for generating a timing phase signal and or wherein each of said loop filters is adapted for generating a frequency offset signal.

14. The system according to claim 11, wherein each of said loop filters generates a timing phase signal and wherein each of said loop filters generates a frequency offset signal, wherein the system further comprises:
    feedback lines adapted for feeding a selected timing phase signal and a selected frequency offset signal back from the multiplexers to a respective input port of at least one loop filter.

15. The system according to claim 13, also comprising:
    two loop filters; and
    a timing phase determination unit adapted for determining said timing phase $\tau_k$, as:

$\tau_k = \tau_{k-1} + \gamma \ast \Delta\tau_{k-1}$, wherein:

$\gamma$ is loop gain factor;
    $\Delta\tau_{k-1}$ is a timing error.

16. The system according to claim 13 further comprising:
using at least two loop filters; and
a timing phase/frequency offset determination unit adapted for determining said timing phase $\tau_k$ and said frequency offset $\Delta T_{k-1}$, said frequency offset $\Delta T_{k-1}$ compensating a difference between a modulation rate of said received signals and a frequency of said sampling clock of said analog-to-digital converter, as:

$\tau_k = \tau_{k-1} + \gamma^* \Delta \tau_{k-1} + \Delta T_{k-1} + \zeta^* \Delta T_{k-1}$, and $\Delta T_k = \Delta T_{k-1} + \zeta^* \Delta \tau_{k-1}$, wherein:

$\gamma$, $\zeta$ are loop gain factors.

17. The system according to claim 13 further comprising:
a voltage controlled oscillator or a digitally controlled oscillator connected to said analog-to-digital converter, wherein said voltage controlled oscillator or a digitally controlled oscillator is adapted for deriving a control signal relating to said timing phase of said analog-to-digital converter.

18. The system according to claim 11, wherein each of said timing error detectors is adapted for:
using two subsequent candidate symbols; and
determining a timing error $\Delta \tau_{k-1}$ by:

$\Delta \tau_{k-1} = -z_{k-1}^* \hat{u}_{k-2} + z_{k-2}^* \hat{u}_{k-1}$, wherein:

$z_i$ is a received signal sample with index i; and
$\hat{u}_i$ is a speculative tentative symbol decision with index i output by said Viterbi detector.

19. The system according to claim 15 further comprising:
two timing error detectors, each one adapted for determining two speculative error signals of said two timing error detectors as:

$\Delta \tau_{k-1,1} = -z_{k-1}^* u_{k-2,1} + z_{k-2}^* \hat{u}_{k-1,1}$ $\Delta \tau_{k-1,2} = -z_{k-1}^* \hat{u}_{k-2,2} + z_{k-2}^* \hat{u}_{k-1,2}$, wherein:

$z_i$ is said signal sample with index i; and
$\Delta \tau_{k,y}$ is a timing error with index k provided by one of said timing error detector $y \in \{1,2\}$.

20. The system according to claim 11, wherein said Viterbi detector is also adapted for:
determining, upon said loop filter not causing any additional delay, said select signal of said Viterbi detector by:

$s_k = \hat{\chi}_k(\mathrm{argmin}_{\chi_k} \Gamma_k(\chi_k))$, wherein:

$s_k$ = select signal with index k;
$\hat{\chi}_k$ = candidate survivor state in said Viterbi detector with index k; and
$\Gamma_k(\chi_k)$ = metric associated with said survivor state $\chi_k$ with index k.

* * * * *